United States Patent
Mukherjee et al.

(10) Patent No.: US 8,214,770 B2
(45) Date of Patent: *Jul. 3, 2012

(54) MULTILAYER OPC FOR DESIGN AWARE MANUFACTURING

(75) Inventors: Maharaj Mukherjee, Wappingers Falls, NY (US); James A. Culp, Downingtown, PA (US); Lars Liebmann, Poughquag, NY (US); Scott M. Mansfield, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 578 days.

This patent is subject to a terminal disclaimer.

(21) Appl. No.: 12/357,648

(22) Filed: Jan. 22, 2009

(65) Prior Publication Data

US 2009/0125868 A1 May 14, 2009

Related U.S. Application Data

(63) Continuation of application No. 11/306,750, filed on Jan. 10, 2006, now Pat. No. 7,503,028.

(51) Int. Cl.
*G06F 17/50* (2006.01)
(52) U.S. Cl. ............... 716/50; 716/51; 716/52; 716/53; 716/54; 716/55
(58) Field of Classification Search ............... 716/50–56
See application file for complete search history.

(56) References Cited

U.S. PATENT DOCUMENTS

| | | | |
|---|---|---|---|
| 6,309,809 B1 | 10/2001 | Starikov et al. | |
| 6,434,721 B1 | 8/2002 | Chiluvuri et al. | |
| 6,532,585 B1 | 3/2003 | Petranovic et al. | |
| 6,634,018 B2 | 10/2003 | Randall et al. | |
| 6,681,376 B1 | 1/2004 | Balasinski et al. | |
| 6,844,244 B2 | 1/2005 | Best et al. | |
| 2002/0199157 A1* | 12/2002 | Cobb | 716/1 |
| 2004/0107410 A1 | 6/2004 | Misaka et al. | |
| 2004/0107412 A1* | 6/2004 | Pack et al. | 716/19 |
| 2004/0216065 A1* | 10/2004 | Cobb et al. | 716/8 |
| 2004/0219436 A1 | 11/2004 | Zhang | |
| 2005/0010890 A1 | 1/2005 | Nehmadi et al. | |
| 2005/0076316 A1 | 4/2005 | Pierrat et al. | |
| 2005/0100802 A1 | 5/2005 | Callan et al. | |
| 2005/0251771 A1* | 11/2005 | Robles | 716/5 |
| 2005/0289500 A1* | 12/2005 | Misaka et al. | 716/19 |
| 2007/0083847 A1* | 4/2007 | Mansfield et al. | 716/21 |
| 2008/0276216 A1* | 11/2008 | Nakano et al. | 716/21 |

FOREIGN PATENT DOCUMENTS

| | | |
|---|---|---|
| JP | 70944054 | 9/1995 |
| JP | 08-334888 A | 12/1996 |
| JP | 10-239826 A | 9/1998 |
| JP | 2003-043666 A | 2/2003 |
| JP | 2004-004941 A | 1/2004 |

* cited by examiner

*Primary Examiner* — Paul Dinh
(74) *Attorney, Agent, or Firm* — Catherine Ivers; Katherine S. Brown

(57) ABSTRACT

A method is provided for designing a mask layout for an integrated circuit that ensures proper functional interaction among circuit features by including functional inter-layer and intra-layer constraints on the wafer. The functional constraints used according to the present invention are applied among the simulated wafer images to ensure proper functional interaction, while relaxing or eliminating the EPE constraints on the location of the wafer images.

35 Claims, 16 Drawing Sheets

MULTILAYER OPC FOR DESIGN AWARE MANUFACTURING

CROSS-REFERENCE TO RELATED PATENT APPLICATIONS

This Patent Application is a Continuation Patent Application of U.S. patent application Ser. No. 11/306,750 filed on Jan. 10, 2006.

BACKGROUND OF THE INVENTION

This invention relates generally to the field of optical lithography, and more particularly, to a method for incorporating inter-layer constraints in an Model Based Optical Proximity Correction (MBOPC) software tool for use in an optical lithography system, to provide accurate correction of the device shapes in a photo-mask that fulfill required performance criteria for the resulting Very Large Scale Integrated (VLSI) circuit.

The optical micro-lithography process in semiconductor fabrication, also known as the photolithography process, consists of duplicating desired circuit patterns onto semiconductor wafers for an overall desired circuit performance. The desired circuit patterns are typically represented as opaque, complete and semi-transparent regions on a template commonly referred to as a photomask. In optical micro-lithography, patterns on the photo-mask template are projected onto the photo-resist coated wafer by way of optical imaging through an exposure system.

The continuous advancement of VLSI chip manufacturing technology to meet Moore's law of shrinking device dimensions in geometric progression has spurred the development of Resolution Enhancement Techniques (RET) and Optical Proximity Correction (OPC) methodologies in optical microlithography. The latter is the method of choice for chip manufacturers for the foreseeable future due to its high volume yield in manufacturing and past history of success. However, the ever shrinking device dimensions combined with the desire to enhance circuit performance in the deep sub-wavelength domain makes it increasingly more difficult for complex OPC methodologies to achieve high fidelity of mask patterns while also ensuring proper circuit performance on the printed wafer.

A Very Large Scale Integrated (VLSI) circuit consists of several patterned physical layers of material on top of one-another on a wafer, fabricated as patterned shapes on a wafer. In a typical VLSI Circuit, the bottom-most layer of a circuit consists of the diffusion layer (RX) which creates the source and the drain regions of the Complimentary Metal Oxide Silicon Field Effect Transistors (CMOS-FET, or CMOS). The layer above RX consists of a poly-silicon (PC) layer. The regions of PC layers that overlap the RX regions are called the gate regions and the rest of the PC layers connect several CMOS transistors. The source, drain and the gate regions are connected by contact pads (CA) to several layers of metal interconnects (Mx, for x=1, 2, 3, ... ). Each layer of metal is connected to the metal layer above by a via layer (Vx, for x=1, 2, 3, ... ). In the current art, there can be a score of metal and via layers in the final VLSI circuit.

The lithographic process used to form a given physical layer on the wafer includes designing one or more mask shape layouts used to transfer the circuit design shapes to the wafer. Optical proximity correction (OPC) is a process used to optimize the shapes on the mask so that the transfer of mask patterns to the physical layer reproduces the desired circuit design shapes with optimal fidelity. Typically the lithographic process for each physical layer is considered independently of the other physical layers.

Current OPC algorithms pre-correct the mask shapes by segmenting the shape edges and shifting the position of the segments by small amounts. In the current state of the art, Model-Based OPC (MBOPC) software emulates the physical and optical effects that are mostly responsible for the non-fidelity of mask shapes printed on the wafer, as will be described hereinafter with reference to FIG. 1. In the correction phase of MBOPC, the mask shapes are iteratively modified so that the shapes printed on the wafer match the desired shape as closely as possible. This method automatically deforms existing mask shapes to achieve the target dimensions on the wafer. However, the current art can not objectively incorporate and satisfy the proper functioning of the circuit.

The aforementioned methodology for single layer MBOPC is illustrated in FIG. 1. In the current state of the art, an input mask layout 101 and a target image 106 are provided. The mask shapes are divided into segments to form segmented mask shapes 103, where each segment is typically provided with a self-contained evaluation points at which values of the mask image will be computed. The optical and the resist image are then evaluated at evaluation points (Block 104). The images at each of the evaluation points are then checked (Block 105) against the target image 106 to ensure the simulated image is within predetermined tolerances. Stated another way, the deviation of the edges of simulated mask image with respect to the edges of the target image, referred to as Edge Placement Errors (EPEs), should be within predetermined tolerances. Here, an edge of an image shape may be defined by the image intensity contour that equals or exceeds the dose-to-clear value for the lithographic process, and depends on the type of resist used. Typically, EPE tolerances are expressed as geometric rules or constraints on the image shapes relative to shapes on the same physical layer. If the image does not remain within tolerance or the allowable EPE, the segment is iteratively moved forward or backward 107 until all of the simulated image edges are located within an accepted tolerance of the location of the target image edges. Eventually, the final corrected mask layout is outputted 108.

For the proper functioning of the circuit, it is important that each layer overlaps the following layer in the proper region and their overlapping area satisfy certain tolerance criteria. For example, it may be more important for proper functioning of the circuit that the contact layers and the metal layers overlap properly at the circuit level and that they have sufficient overlap regions, whereas the specific location of the edges of such overlapped regions may not be as critical.

In the current art of MBOPC, the mask is corrected in such a way that only one layer can be fabricated according to the specifications. Though it is important that each layer is fabricated to its individual specifications, it is equally important to ensure that the inter-layer specifications are also satisfied.

In view of the above, there is a need for an OPC methodology that considers proper functioning of the interacting circuit layers, for example, by considering overlapping shapes among the layers of the circuit.

SUMMARY OF THE INVENTION

Accordingly, it is an object of the present invention to provide a method for designing a mask layout of an integrated circuit that ensures proper functional interaction among layers.

It is another object of the present invention to incorporate specifications of functional intra-layer and inter-layer constraints in Model Based Optical Proximity Correction (MBOPC).

It is a further object of the present invention to provide a method for MBOPC whereby functional constraints are given higher priority than edge placement error constraints.

It is yet another object of the present invention to ensure mask layouts that prevent failure of the Very Large Scale Integrated (VLSI) circuit and improve yield.

These and other objects, aspects, and advantages of the invention are provided by a method for computing a model-based optical proximity correction on shapes present in a mask layout that is used for an optical lithographic process. The computation depends on specification of inter- and intra-layer constraints, and more specifically, functional inter-layer and functional intra-layer constraints. According to the present invention, edge placement error constraints may be relaxed, or eliminated, in favor of functional constraints.

According to one aspect of the invention, method is provided of designing a mask layout for an integrated circuit, the method comprising the steps of: providing a plurality of mask shapes corresponding to a plurality of layers; providing lithographic models for said plurality of layers, said models describing processes according to which wafer images are transferred from said mask shapes to a wafer; determining simulated wafer images resulting from transferring said plurality of mask shapes in accordance with said models; providing constraints comprising functional constraints that ensure proper functional interaction among said simulated wafer images; evaluating said simulated wafer images relative to other of said simulated wafer images; and if said constraints are violated, modifying said mask layout to correct said violations.

The functional constraints may comprise inter-layer constraints as well as intra-layer constraints. It is noted that, unlike conventional MBOPC which applies edge placement error (EPE) constraints within a given layer and relative to the location of a design target image, the functional constraints used according to the present invention are applied among the simulated wafer images, while relaxing the EPE constraints on the location of the wafer images.

According to another aspect of the invention, target images may be provided, which represent the desired images on the wafer, along with appropriate edge placement error (EPE) constraints may be included in addition to functional constraints, but the functional constraints are given higher priority than EPE constraints.

Modifications of the mask layout in accordance with the invention may be performed by modifying the circuit design shapes or resolution enhancement technology (RET) design shapes, such as phase shift shapes, trim mask shapes, block mask shapes, subresolution assist features (SRAFs), fill shapes and negative fill shapes, and may also include placement of such RET shapes.

The method according to the invention may be implemented in a computer system or in a computer program product. The method may be provided as a service to a client that desires a mask layout that will ensure proper function interaction among the layers of the integrated circuit and improve yields.

Other objectives, advantages and aspects of the present invention will be more readily understood and made apparent with reference to the following detailed description.

BRIEF DESCRIPTION OF THE DRAWINGS

The invention will be better understood from the following detailed description with reference to the drawings listed below, which are not necessarily drawn to scale.

DETAILED DESCRIPTION

Figure 1:
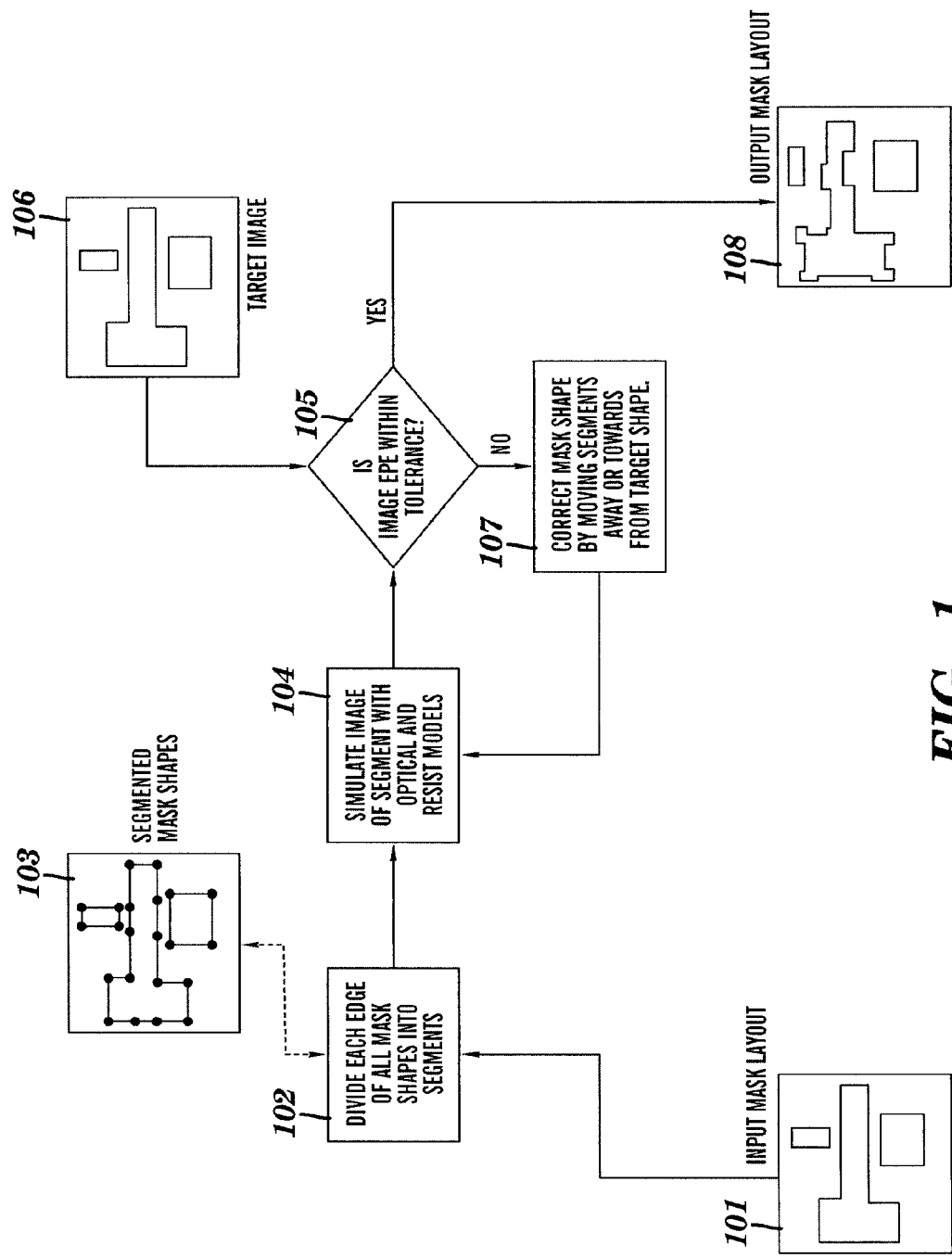
FIG. 1 illustrates a flow chart of a conventional optical proximity correction methodology.

In describing the preferred embodiment of the present invention, reference will be made herein to the drawings in which like numerals refer to like features of the invention. The features in the drawings are not necessarily drawn to scale.

The present invention is ultimately used in optical lithography to correct for any distortions on a photo-mask having patterns of circuit design features, in order to achieve a projection thereof on the photo-resist coated wafers, such that the proper functionality of the circuit is ensured. In accordance with the present invention, model-based OPC is performed in which conventional edge-placement error (EPE) constraints are relaxed or replaced with intra-layer and inter-layer constraints and specifications that ensure proper interaction among more than one layer.

Figure 2:
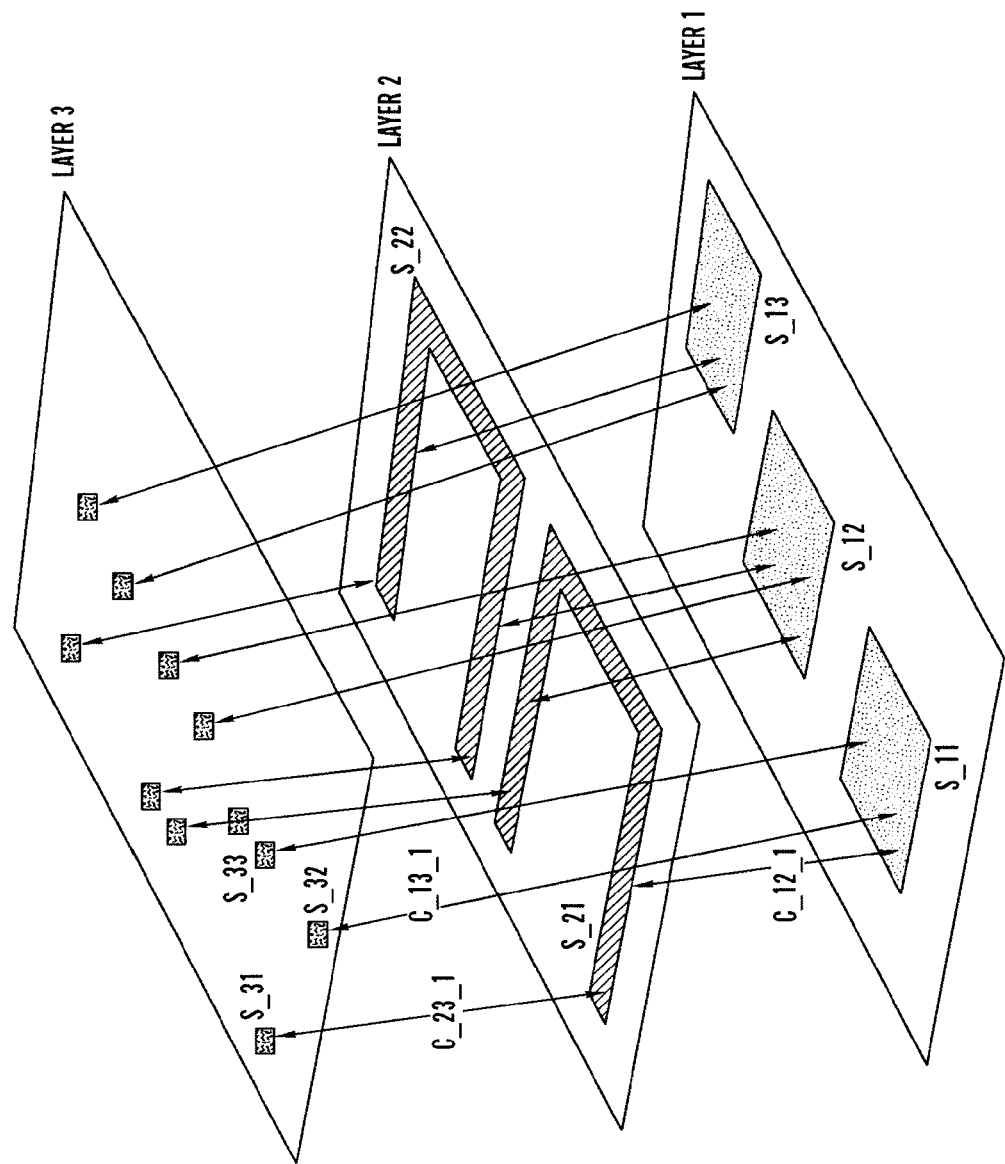
FIG. 2 is a schematic illustration of three design layers including circuit design shapes, the interaction among layers and inter-layer constraints.

Referring to FIG. 2, the relationship among several layers is illustrated. Here we have shown three layers, viz., Layer 1, Layer 2 and Layer 3. The mask layouts corresponding to these layers include mask shapes representing various circuit design features. In this example, Layer 1 represents a diffusion layer or active region (RX). There are three shapes on Layer 1, viz., S_11, S_12 and S_13. This example is for the purpose of demonstration only. In a real mask there can be millions of shapes. On Layer 2, there are two shapes: S_21 and S_22, which represent polysilicon lines (PC) in this example. On Layer 3, there are several shapes: S_31, S_32, S_33, etc., which represent contacts (CA) in this example. One of the inter-layer constraints among the shapes of Layer 1 and Layer 2 are depicted as C_12_1. Similarly, one of the inter-layer constraints among the shapes of Layer 2 and Layer 3 are depicted as C_23_1. Similarly, one of the inter-layer constraints among the shapes of Layer 1 and Layer 3 are depicted as C_13_1. These inter-layer constraints are described in more detail below.

Figure 3:
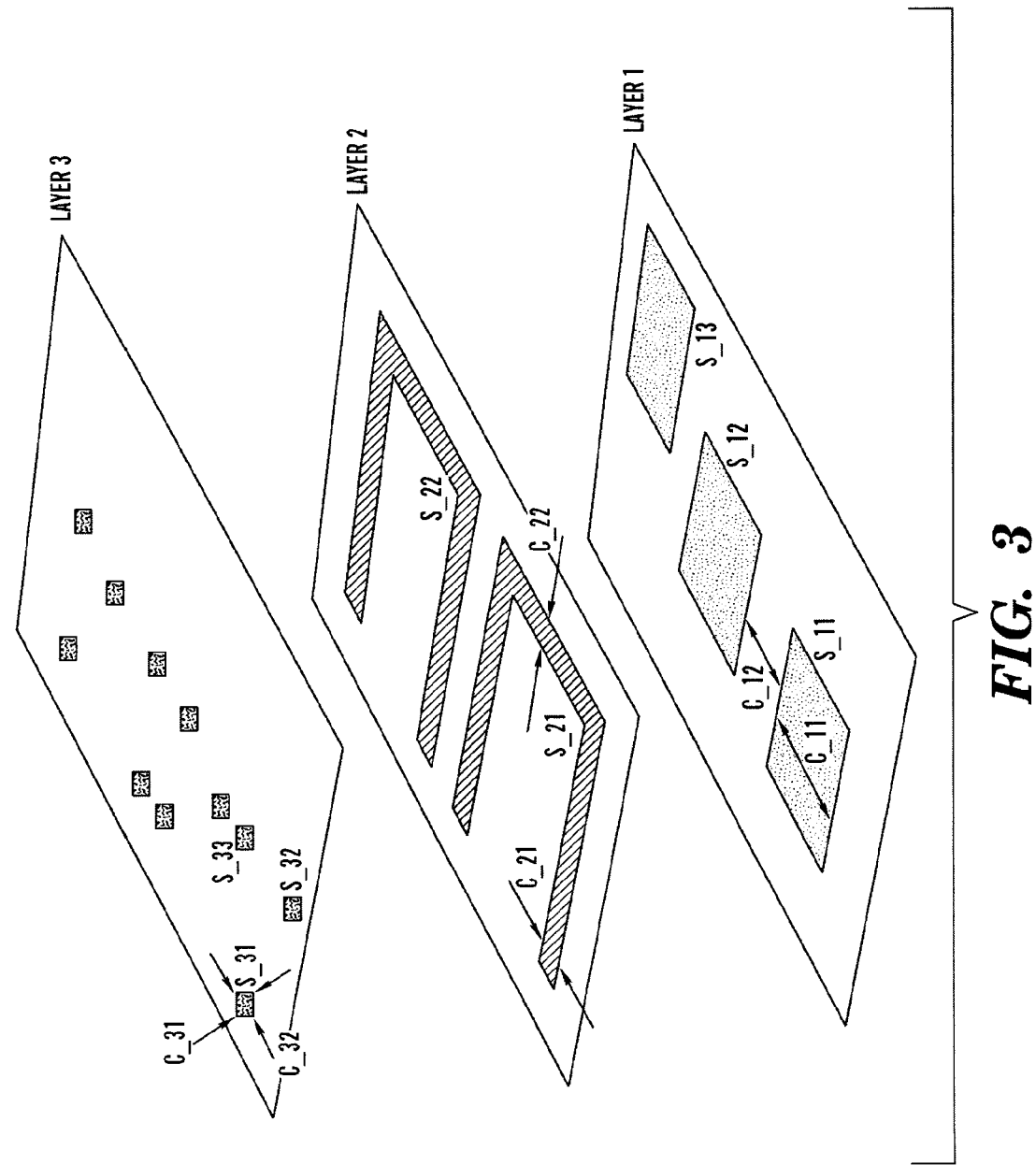
FIG. 3 is a schematic illustration of three design layers including design shapes and intra-layer constraints.

In addition to this, this invention considers the intra-layer constraints that exist within each of the layers. This is illustrated in FIG. 3. In this figure we show the same three layers Layer, 1, 2, and 3 as we have shown in FIG. 2 and consider the same shapes as shown in each layer. Some examples of intra-layer constraints on Layer 1 are shown as C_11 and C_12 respectively. C_11 is an example of a width constraints and C_12 is an example of spacing constraints. A width constraint typically describes a minimum width or length that the image must satisfy. A spacing constraint typically describes a minimum spacing between two shapes that must be satisfied. Similarly, C_21 and C_22 are example of width constraints on the shape S_21 on Layer 2. Similarly, C_31 and C_32 are example of width constraints on the shape S_31 on Layer 3.

Conventional MBOPC uses constraints that consider EPE constraints on a single layer, without considering the interaction among shapes from different layers. By contrast, in accordance with the present invention, EPE constraints are relaxed or may be eliminated, and both intra-layer and inter-layer functional constraints are selected that ensure the functional interaction of shapes from all interacting layer shapes required to manufacture a particular VLSI chip. Such functional constraints may be determined by simulation or provided by a circuit designer or lithographer, for example.

Intra-layer constraints for MBOPC may be provided between the simulated wafer image shape and a target shape, or between features of the simulated wafer image shape itself. The wafer shape can be simulated by computing the image at multiple points at the target shape and then interpolating the contour.

Figure 4:
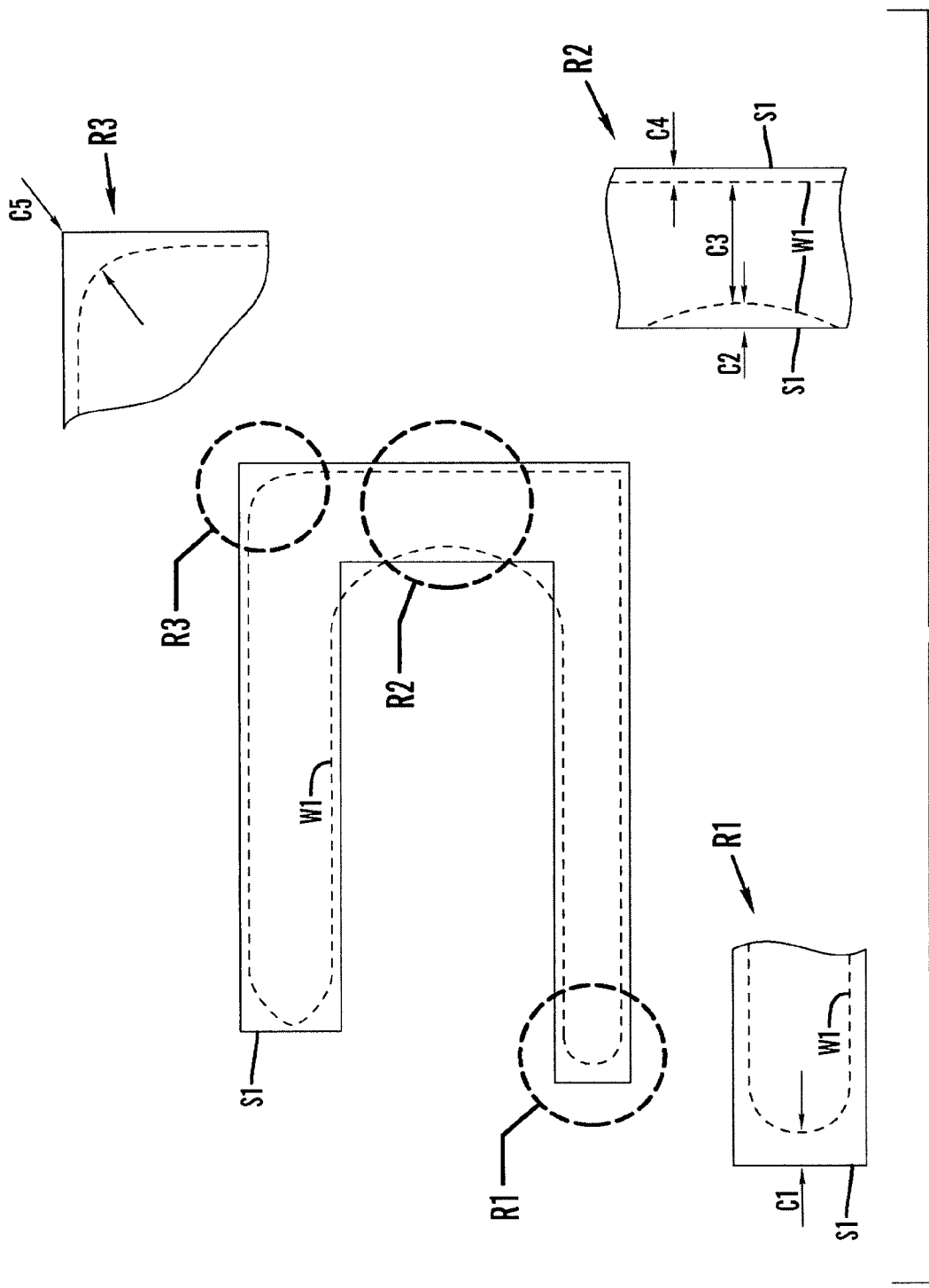
FIG. 4 is a schematic illustration of a layer 2 design shape for a polysilicon line and a corresponding image shape projected on to the same plane.

FIG. 4 illustrates examples of intra-layer constraints using Layer 2 shapes for polysilicon lines (or lines formed from other suitable conductive materials as known in the art) as an example. Shapes in this example from Layer 2, may be used to form gates of transistor devices on CMOS VLSI chips, where the polysilicon lines intersect the active or diffusion regions (RX) from Layer 1, for example. Other parts of such lines may serve other functions, such as a bitline or wordline. For the purposes of this description, such line shapes are hereinafter referred to as "poly line" shapes, but is not intended to be limited to lines made of polysilicon nor limited to the portions intersecting the diffusion regions, but includes the entire shape of such a line feature. Referring to FIG. 4, a target poly line image shape S1 and simulated line image shape W1 are projected on to and overlain on the same plane. Three regions of the overlain target image S1 and simulated image W1, indicated by the circled regions R1, R2, and R3, are expanded to further illustrate examples of intra-layer constraints. In Region R1, the constraint C1 depicts the maximum allowable line-end pull back and shows how far the simulated image W1 is allowed to pullback from target image S1. In Region R2, constraints C2 and C4 depict the maximum allowable edge placement (EPE) deviations of the simulated image W1 from the target image S1 at an evaluation point. The constraint C3 depicts the allowable critical dimension (CD) (i.e. the minimum allowable width) of the simulated wafer image W1. In Region R3, constraint C5 depicts the maximum allowable corner distance, or allowable corner rounding, between the simulated image W1 and target image S1.

Figure 5:
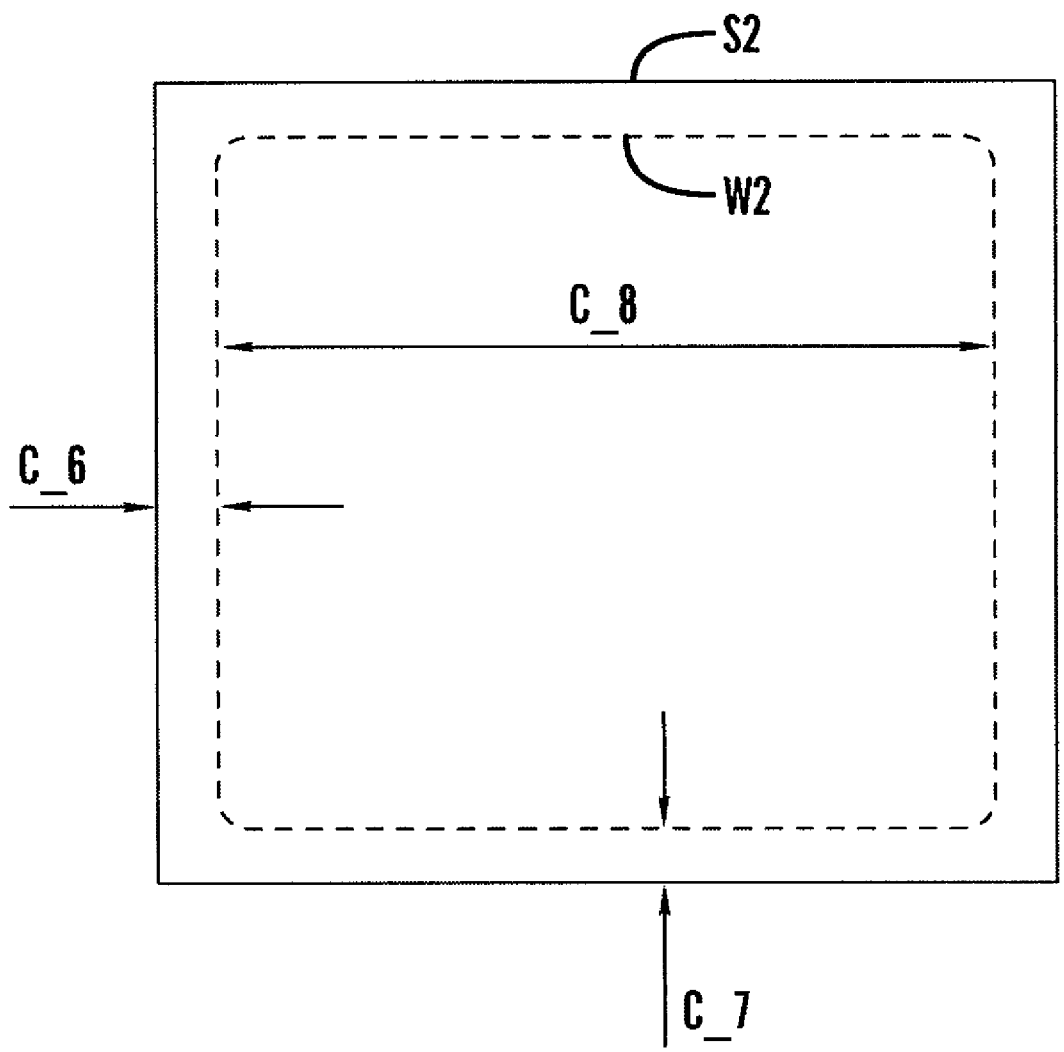
FIG. 5 is a schematic illustration of a layer 3 design shape for a contact and a corresponding image shape projected on to the same plane.

Another example of intra-layer constraints is further illustrated in FIG. 5, for Layer 3 shapes comprising a contact shape, where the target contact shape is S2 is shown overlain on to the same projection plane with a corresponding simulated wafer image W2. The EPE constraints C_6 and C_7 depict the maximum allowable edge placement errors of the simulated image W2 from the target image S2. The CD constraint C_8 is the constraint defining the minimum width that the contact shape S2 must achieve.

In conventional MBOPC, OPC is performed on each layer by considering the EPE constraints depicted within that layer only. In accordance with the current invention, constraints that ensure functionality among multiple layers are obeyed.

Figure 6A:
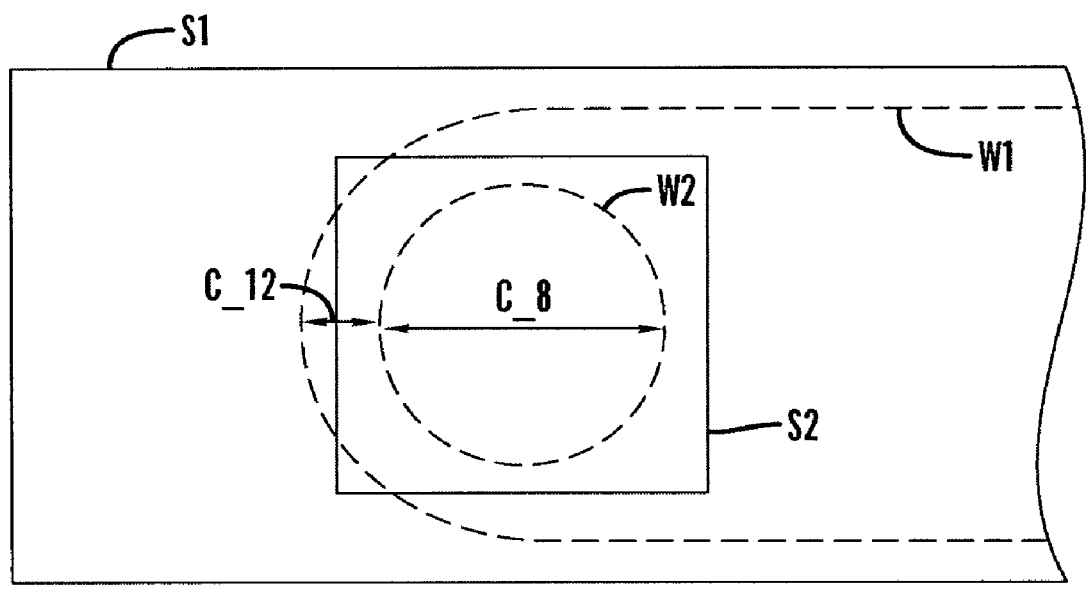
FIG. 6A is a plan view of a projection on to the same plane of the layer 2 and layer 3 design shapes and corresponding wafer images.

One example is illustrated in FIG. 6A, which illustrates the overlaying of shapes from two interacting layers on to the same projection plane, specifically a poly line shape S1 from layer 2 and a contact shape S2 from a layer 3. Overlain on to the same projection plane are the corresponding simulated wafer images for a layer 2 poly line shape W1 and a layer 3 contact image shape W2, respectively. It is desired for the proper functioning of the circuit that the poly line image W1, totally encloses the contact image W2, as well as ensuring that the contact image W2 has a minimum CD. This is not ensured solely by using the EPE intra-layer constraints, as depicted in FIG. 4 and FIG. 5. In accordance with the present invention, to ensure that the contact image W2 is enclosed by the poly line image W1, an inter-layer enclosure constraint C_12 is imposed that requires that the contact image contour W2 is completely enclosed by the poly line image W1. The location of the exterior edge of the contact image W2 must be within the interior of the edge of the poly line image W1, and equal to or greater than a minimum distance C_12. Here, the sign of a distance from the edge of the image is defined as positive if the location of the contact image edge W2 is in a direction towards the interior of the poly line image W1, and negative if the distance is in a direction towards the exterior of the line poly image W1. Thus, in this example, enclosure of the contact by the poly line is assured by a positively valued enclosure constraint C_12. The intra-layer CD constraint C_8, must also be satisfied. However, it is less critical that the EPE constraints C_6 or C_7 on the location contact image W2 relative to the location of the target image S2 is satisfied, or the EPE constraint C_1 between the line-ends of the line target S1 and the line-end of the simulated image W1, as long as the inter-layer enclosure constraint C_12 is satisfied. Thus, in accordance with the present invention, intra-layer and inter-layer constraints are used in the inventive OPC methodology that focus on and ensure proper functioning of shapes among interacting layers, while relaxing or eliminating constraints that focus on specific location of the images. It should be noted that constraints among interacting layers need not be limited to sequential interactions, but may include interactions among relatively distant layers, where there may be electrical interactions, or the like. For example, on the physical embodiment of an integrated circuit, either a via or a contact may be in electrical connection with a poly line, a diffusion region or an interconnect, thus an inter-layer enclosure constraint may be imposed such that a contact shape or a via shape must be enclosed by a poly line shape, a diffusion region shape, an interconnect shape, or a combination thereof.

Figure 6B:
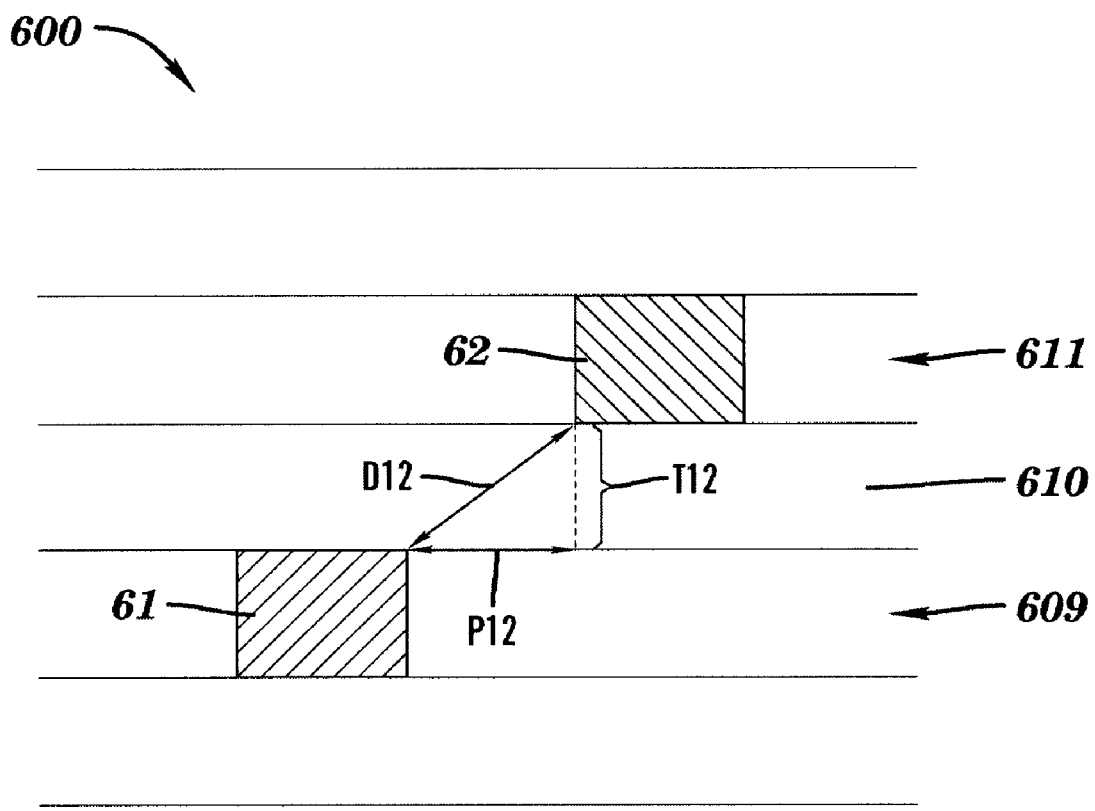
FIG. 6B is a cross-section view of a substrate including two interconnect features on different layers.
Figure 6C:
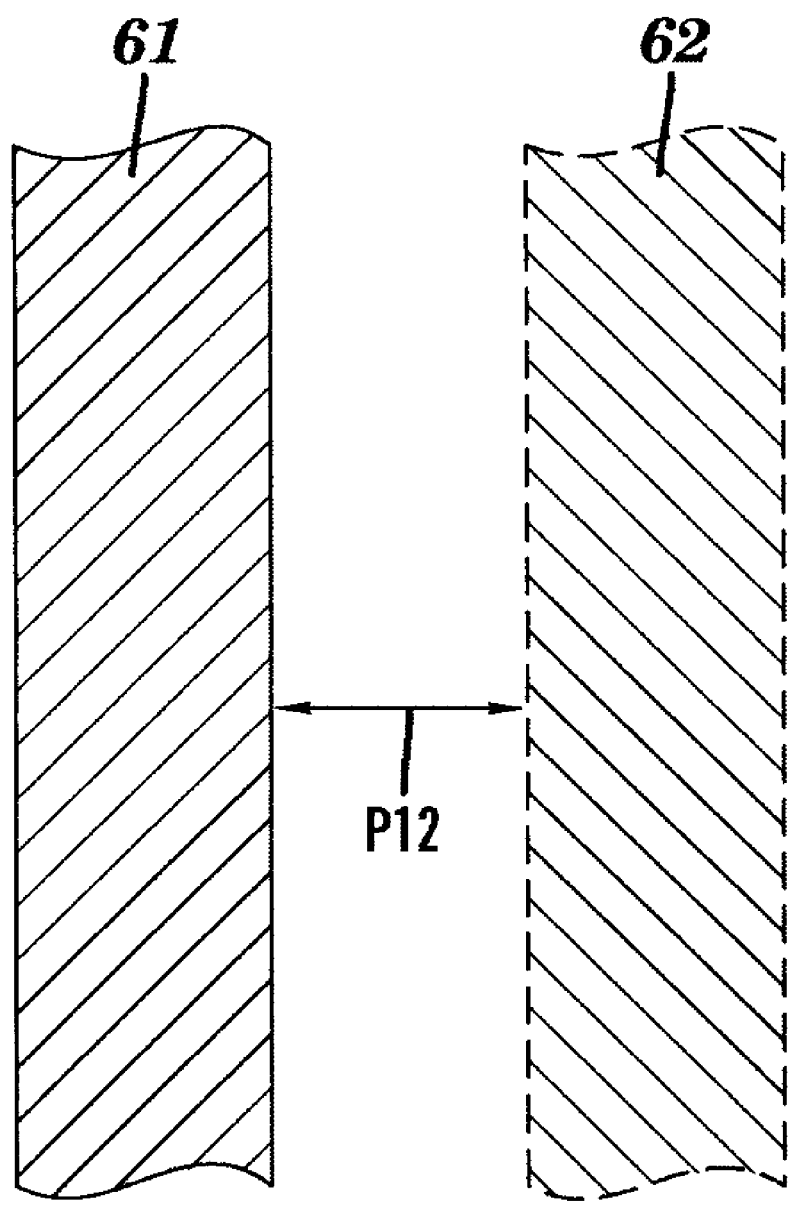
FIG. 6C is a plan view of the two interconnect features of FIG. 6B, projected on to the same plane.

Another example of an inter-layer constraint in accordance with the present invention is illustrated in FIGS. 6B and 6C. An interconnect line 61 embedded in a first layer 609, and a second interconnect line 62 embedded in a second layer 611 are illustrated in a cross-section view of a wafer 600 in FIG. 6B, where a dielectric third layer 610 is interposed between the first layer 609 and the second layer 611. FIG. 6C illustrates the projection of the interconnect shapes 61, 62 on to the same plane, where the shapes 61, 62 both have substantially the same orientation, and in this example are substantially parallel to each other. Such similarly oriented interconnect lines on two different layers must be separated by a minimum distance so that the parasitic capacitance between the lines is not too high. High parasitic capacitance tends to reduce the speed of data flow along the lines, thus negatively impacting the performance of the circuit. In this example, the required minimum distance may be expressed as an inter-layer constraint D12. Alternatively, given the thickness T12 of the intervening layer 610, the inter-layer constraint may be expressed as an inter-layer constraint P12 on the common projection plane.

The foregoing illustrates only two examples of function inter-layer constraints in accordance with the present invention, and is not meant to be limited to those examples, and one skilled in the art would recognize that many other types of functional inter-layer constraints may be determined, including, but not limited to, circuit simulations, design rules, circuit designers, lithographic considerations, manufacturability considerations, and the like.

Figure 7:
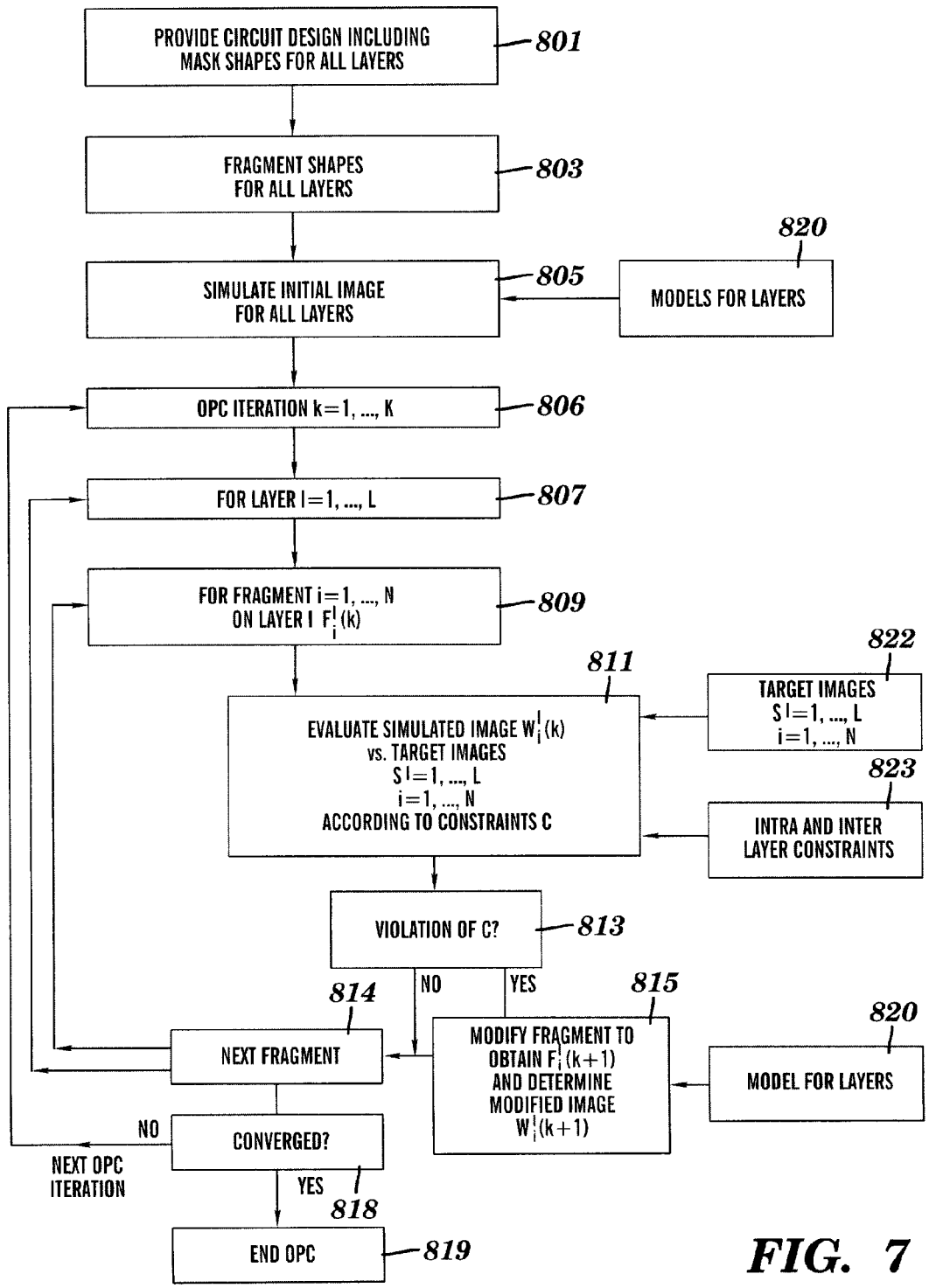
FIG. 7 is a schematic flow chart of one embodiment of the method according to the present invention.

A preferred embodiment of the process according to the current invention is illustrated in FIG. 7. The design inputs, in particular, all mask shapes associated with the physical layers are provided in terms of all the relevant layers, viz., l=1, ..., L (Block 801). Each layer is associated with corresponding models for simulation, viz., M1, M2, M3, ..., ML (Block 820). Target image shapes S(l,i), l=1, ..., L for each of L layers and i=1, ..., N for each of N fragments are provided (Block 822), noting that the number of fragments N may be different on each layer. In addition to these target shapes there may be additional shapes present for resolution enhancements techniques (RET) such as Sub Resolution Assist Features (SRAFs) and also for yield and manufacturability enhancements such as fill shapes and negative fill shapes (not shown). In addition to modifying the shapes of the circuit features on the masks, other aspects of the mask layout may be modified, such as the shape or placement of RET shapes. Some of these additional shapes may not be modified during MBOPC, but may be used in the simulation, for example, as part of the lithography process model, due to their influence on the simulated image shapes. In the case of some layers, more than one mask shape may be associated for a single target shape. For example, in case of alternating phase shift masks (altPSM), each target shape can be associated with three types of mask shapes, including 0 and 180 degree phase shift shapes, block, or trim mask shapes, and all three may be need to be modified during MBOPC, so that the simulated wafer image meets the specified constraints between the simulated wafer image and the target shape. In addition, modification of SRAF shapes and placement may be considered in the MBOPC algorithm. In addition to the shapes, all of the inter- and intra-layer constraints are provided (Block 823).

Figure 8:
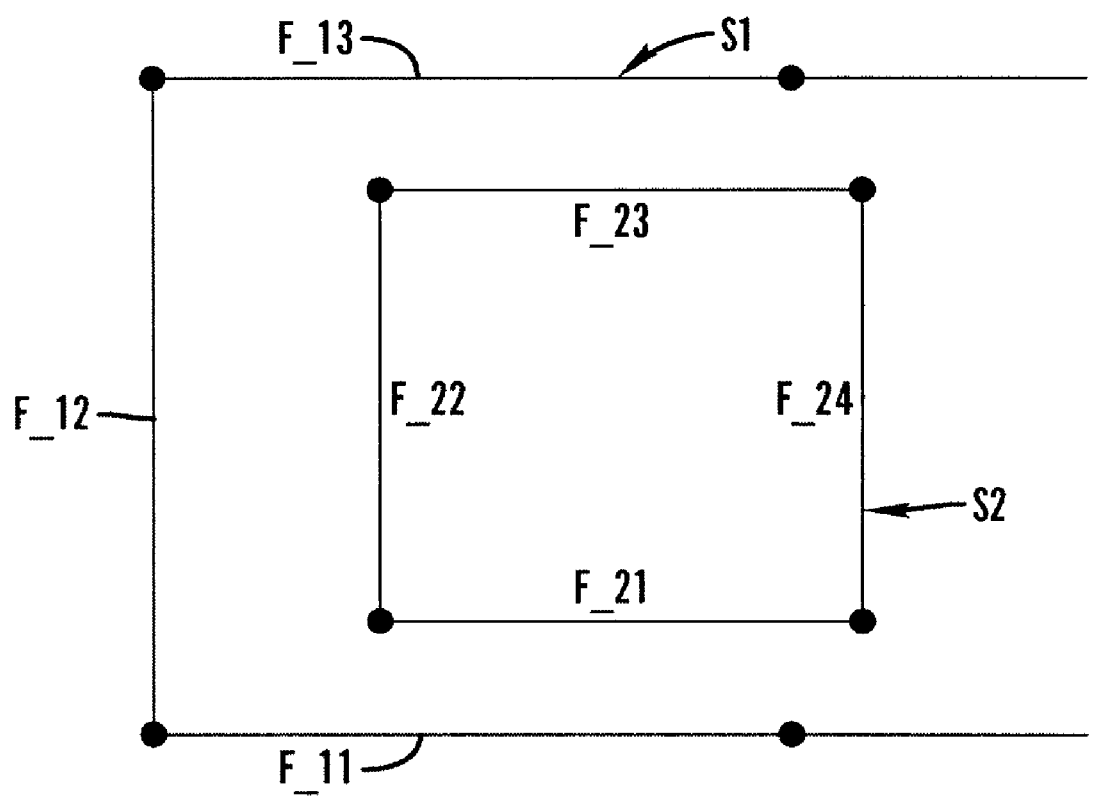
FIG. 8 is a schematic illustration of two fragmented design shapes from two different layers, overlain on the same projection plane.

Each mask shape on each layer is fragmented (Block 803). The fragmentation, or segmentation, can be performed by any means now known or developed in the future, such as rules-based, or adaptive and model based. If more than one mask shape is associated with the target shape, for example, as for the case of alternating phase shift masks, all mask shapes will be fragmented accordingly. An example of segmentation is shown in FIG. 8 for two overlayed target shapes from a two different mask layers: S1 representing a portion of a polysilicon line shape on layer 2 and S2 representing a contact shape on layer 3. The line shape S1 is segmented into three fragments F_11, F_12 and F_13. The contact shape S2 is segmented into four fragments, viz., F_21, F_22, F_23 and F_24.

Figure 9:
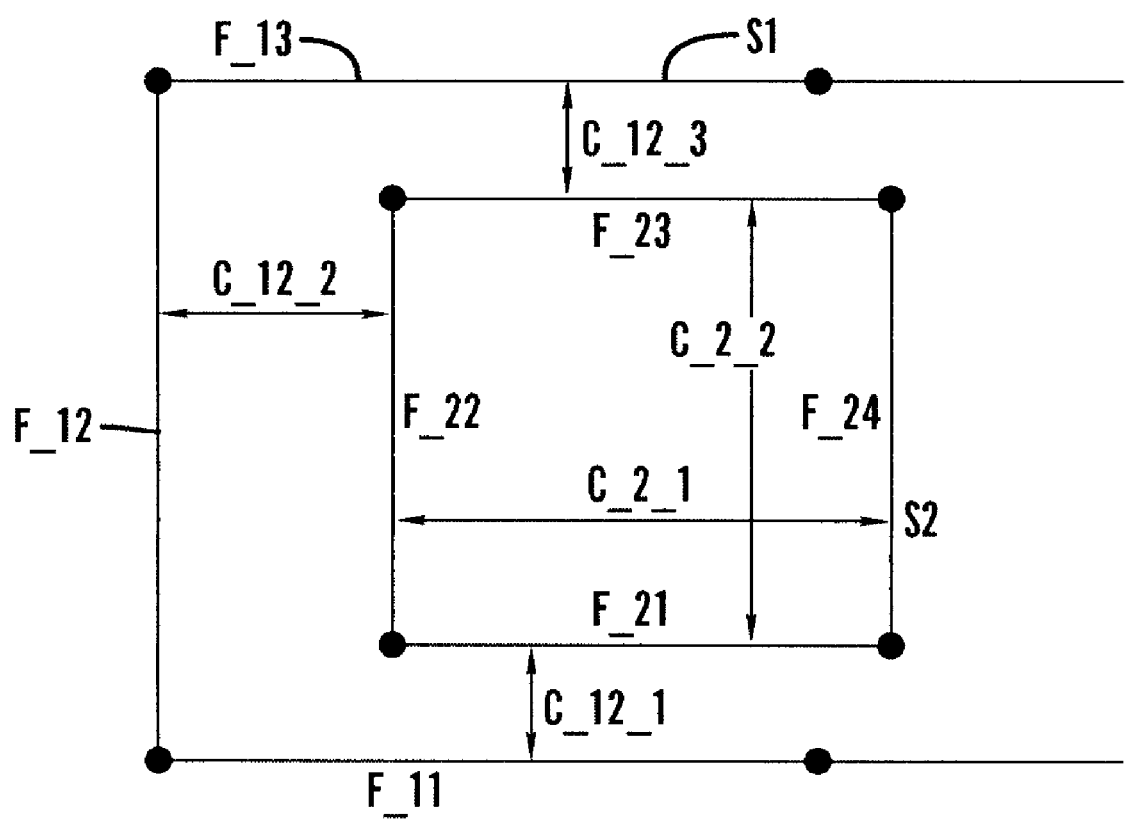
FIG. 9 is a schematic illustration of the fragmented design shapes of FIG. 8, including intra-layer and inter-layer constraints according to the invention.

Next, an initial set of simulated images W(l,i) for each segment (Block 809) are determined, for each layer l (Block 807), for OPC iteration k=0. Each of the segments are associated with the appropriate inter and intra layer constraints C (Block 823). The segments F(l,i) inherit the relevant constraints associated with the mask shapes they came from. As in conventional OPC, each mask shape segment may be associated with a simulated wafer image. This is illustrated in FIG. 9, where the same shapes as in FIG. 8 from layer 2 and layer 3 are considered, but where the shapes have been fragmented and fragments are illustrated as line segments between nodes. In here, C_12_1 denotes the inter-layer enclosure constraint between fragments F_11 of polysilicon line shape S1 from layer 2, and F_21 of contact shape S2 from layer 3; C_12_2 denotes the inter-layer enclosure constraint between fragments F_12 of line shape $S_1$ and F_22 of contact shape S2; and C_12_3 denotes the inter-layer enclosure constraint between fragments F_13 of line shape $S_1$ and F_23 of contact shape S2. The intra-layer CD constraint C_2_1 specifies the minimum distance between fragments F_22 and F_24 of contact shape S2; and the intra-layer CD constraint C_2_2 denotes the minimum distance constraint between fragments F_21 and F_23 of the contact shape S2. In this example, the inter-layer enclosure constraints C_12_1, C_12_2, C_12_3 may be typically any number greater than zero, such as 10 nm. These must be positive to ensure that the contact CA is enclosed by the polysilicon PC shape. Intra-layer CD constraints C_2_1 and C_2_2 denote the minimum length and width of the simulated image of the contact shape S2 and they can be in the order of 50 nm.

All of the simulated images W(l,i) are computed for the initial OPC iteration k=0 (Block 805). The OPC iterations are started (Block 806) by comparing, for example, for each layer l (Block 807), and by each fragment i (Block 809), the image of that fragment for the OPC iteration k W(l,i)(k). Then the simulated images W(l,i)(k) are compared to an appropriate set of target images S(l,i), as well as images arising other fragments and other layers in accordance with both inter-layer and intra-layer constraints (Block 811).

If any of the constraints are violated (Block 813), then the fragment F(l,i) is modified to obtain a new fragment F(l,i)(k+1) at OPC iteration k+1, and a new image W(l,i)(k+1) is determined in accordance with the layer model (Block 820). Next (Block 814), another image and fragment is evaluated in relation to the appropriate set of target images S, simulated images W, and constraints C, until the OPC converges (Block 818). Note that within a given OPC iteration, the evaluation may include new images based on recently modified fragments.

After the OPC algorithm converges (Block 819), then a final set of modified mask shapes are produced.

Figure 10A:
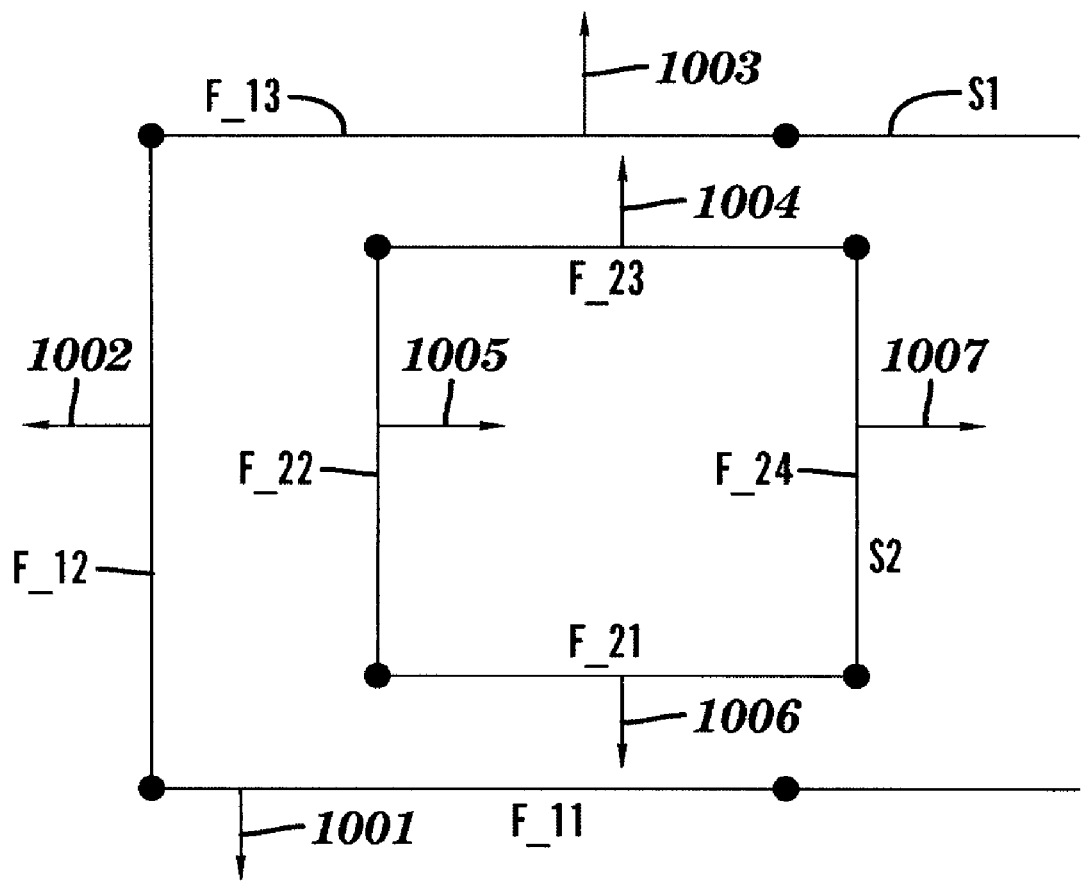
FIG. 10A is a schematic illustration of the direction of possible modifications to the design shapes of FIG. 8, according to the present invention using constraints illustrated in FIG. 9.
Figure 10B:
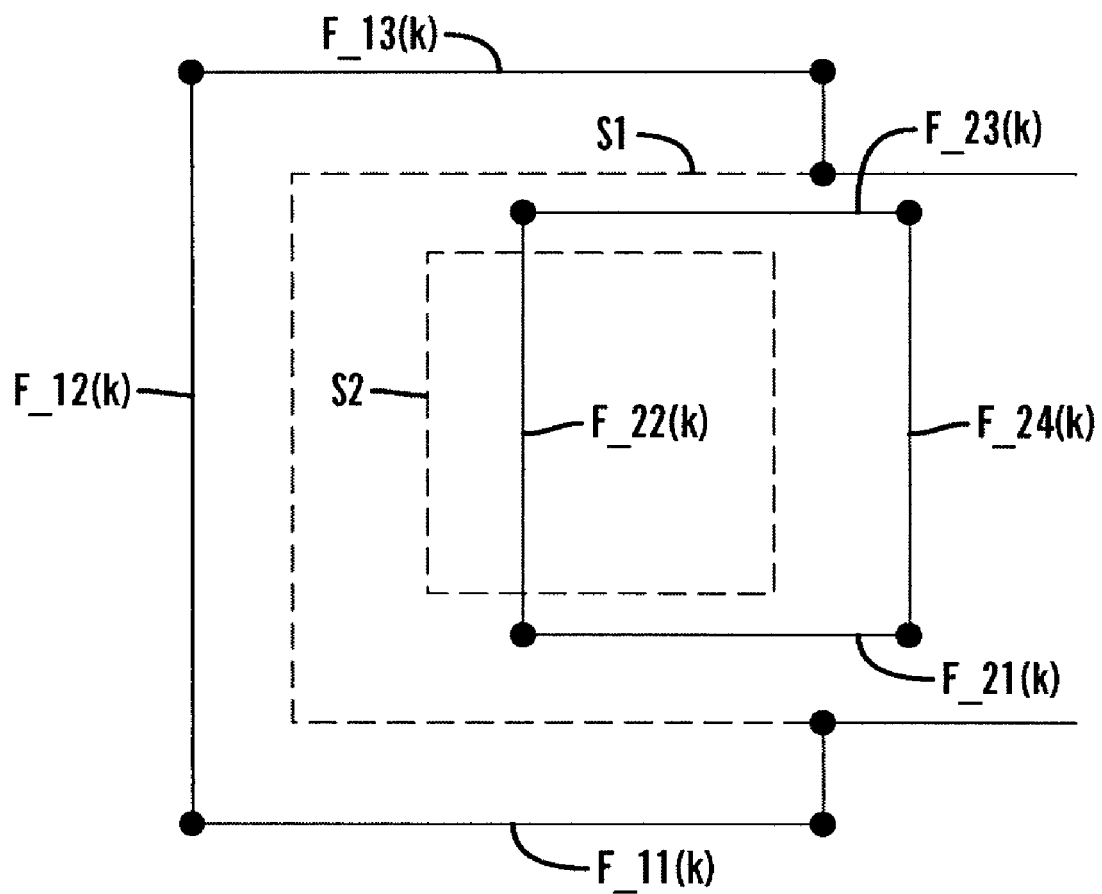
FIG. 10B is a schematic illustration of a possible result for the modified mask layout of FIG. 10A according to the invention.

FIG. 10 provides a schematic illustration of the resulting shapes that would be expected from applying the inventive OPC methodology to shapes in FIG. 8 and intra and inter-layer constraints of FIG. 9. Eventually, the inventive OPC algorithm, as illustrated in FIG. 7, will converge after several iterations K. The resulting direction of movements of all the fragments is illustrated in FIG. 10A. The arrows 1001, 1002 and 1003 denote the directions in which the fragments associated with the line S1 would move, as might be expected to counteract line shortening image behavior. However, the arrows 1004 and 1006 indicate that the fragments F_21 and F_23, respectively, of contact S2 grow wider apart, while the movements 1005 and 1007 of fragments F_22 and F_24 are adjusted away from the line end of S1 as well as from the original position of the contact S2, to final positions F_22(K) and F_24(K), respectively, as illustrated in FIG. 10B. Such a movement of the contact shapes would violate the conventional EPE constraints C_6 and C_7 (see FIG. 5), but would satisfy the enclosure constraints C_12_1, C_12_2, and C_12_3 (see FIG. 9) in accordance with the present invention and ensure proper functioning of the line-contact interaction.

Figure 11:
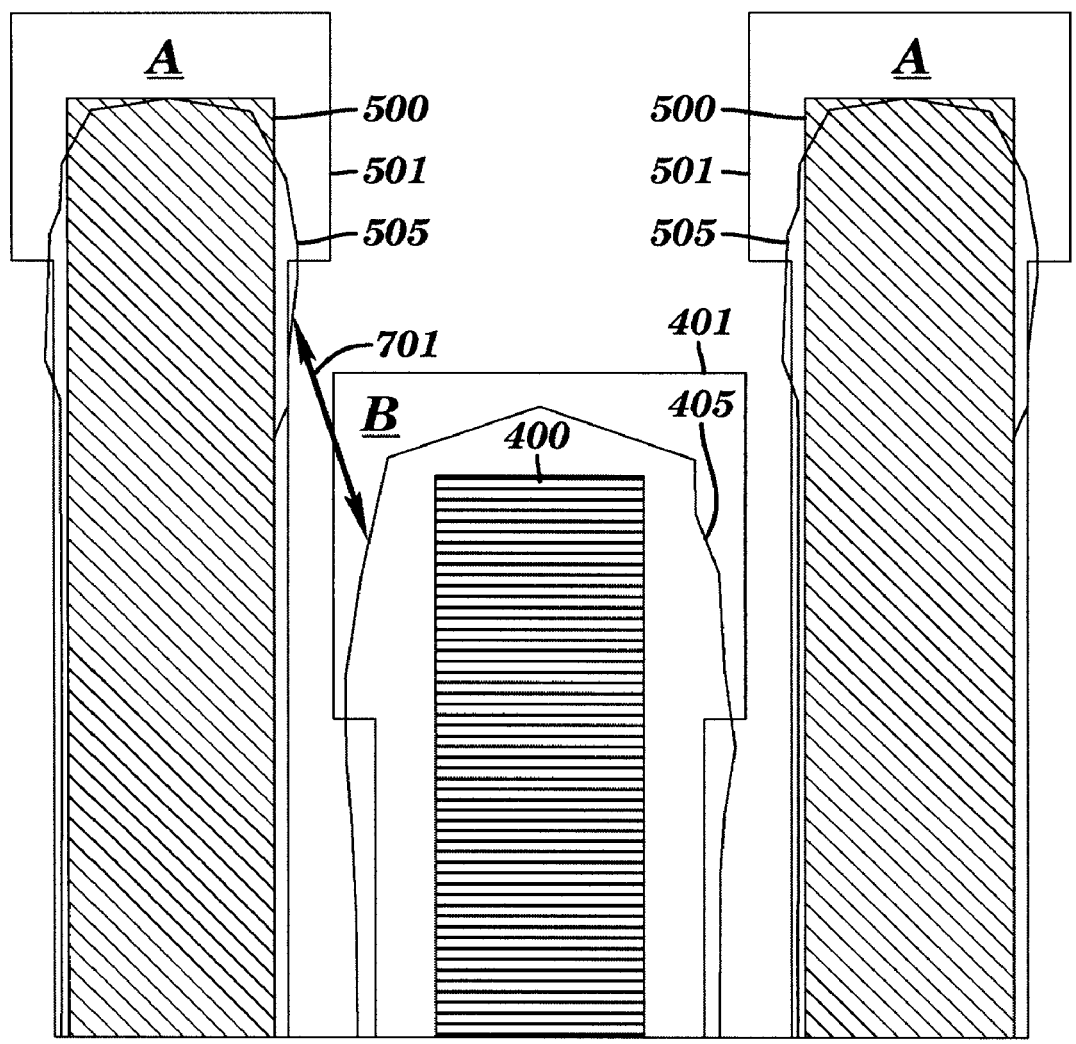
FIG. 11 is a plan view of two interconnect features from different layers projected on to the same projection plane, including modified shapes resulting from a conventional MBOPC.
Figure 12:
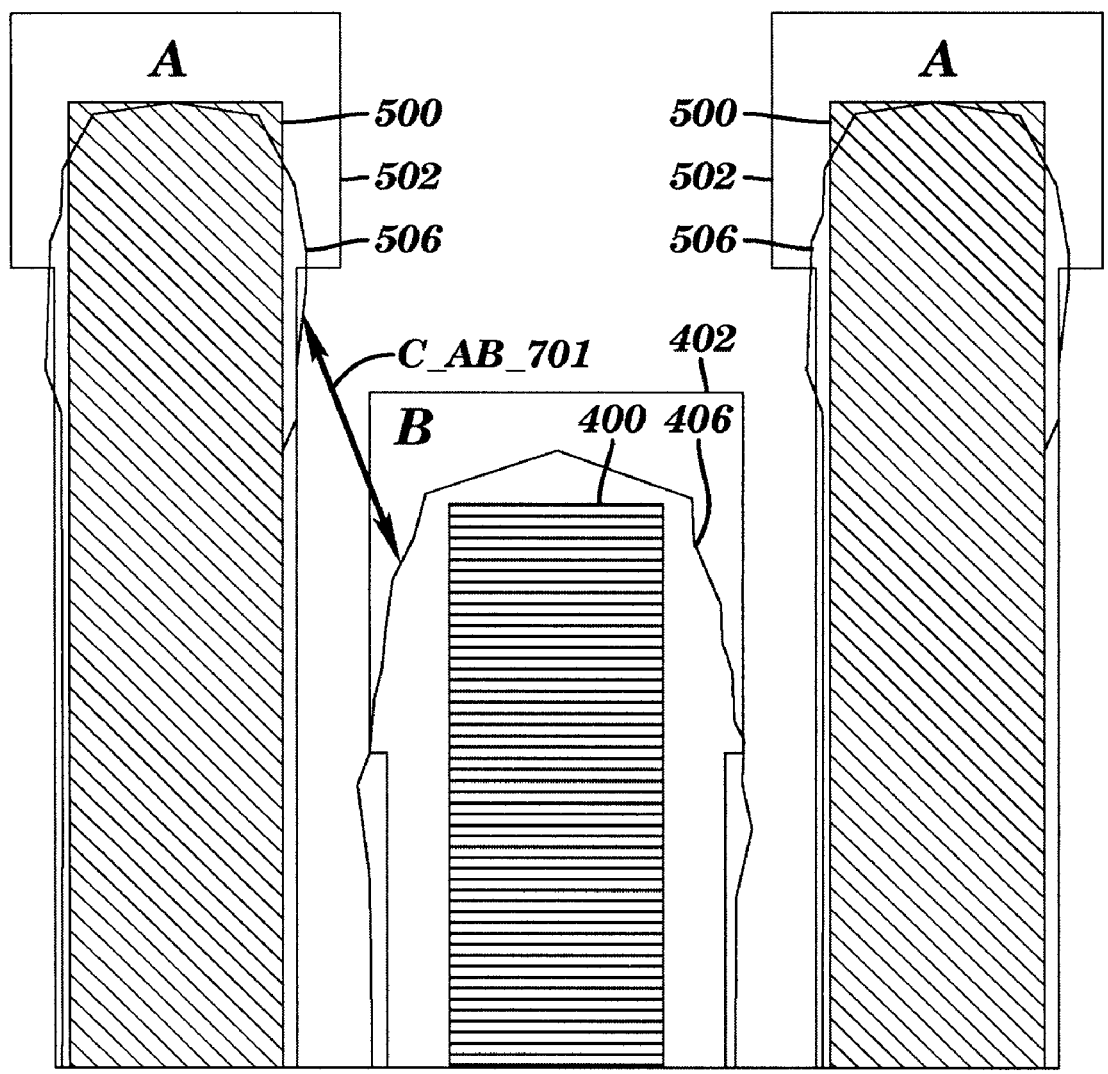
FIG. 12 is a plan view of the two interconnect features from different layers illustrated in FIG. 11, projected on to the same projection plane, including modified shapes resulting from a performing MBOPC in accordance with the present invention.

An example of the benefit of the present inventive OPC methodology over conventional OPC is illustrated by comparison of FIGS. 11 and 12. Two interacting layers are superimposed on the same projection plane in FIG. 11, where Layer A includes shapes representing the gate or poly lines, and Layer B includes shapes representing a first layer of interconnect. For the proper functioning of the circuit it is important that Layer A and Layer B intersect each other only at proper places. Any other intersection may cause a short-circuit and failure of the proper functioning of the chip. In FIG. 11, the target images from Layer A (500) and Layer B (400) are represented by the hashed regions 500, 400, respectively, and also represent the initial mask shapes. After performing conventional OPC, the modified gate shapes 501 represents the OPC-ed shapes corresponding to the gate target image 500 in layer A; and the OPC-ed shape 401 corresponds to the interconnect shape 400 in layer B. Also illustrated are the resulting simulated gate wafer images 505 corresponding to the modified, OPC-ed gate shapes 501 for Layer A, and the simulated interconnect wafer image 405 corresponding to the modified, OPC-ed interconnect shape 401 for Layer B. The smallest overlay distance 701 between the simulated gate images 505 and the interconnect image 405 is too small and can create a loss of yield in the manufacturing of the chip by potentially creating a short-circuit.

Referring to FIG. 12, by contrast, after applying the inventive OPC methodology to the gate shapes 500 of Layer A and interconnect shapes 400 of Layer B, the resulting simulated gate wafer images 506 and simulated interconnect image 406 are separated by an overlay distance that is sufficiently large to avoid improper short-circuits between the interconnect wafer image 406 and the gate wafer image 506. In accordance with the present invention, an inter-layer overlay distance constraint C_AB_701 is imposed to ensure that the interconnect image 406 will remain sufficiently distant from the gate image 506. Using this inter-layer constraint, the inventive methodology resulted in OPC-ed gate shapes 502 corresponding to gate target image 500 in layer A and the OPC-ed interconnect shape 402 corresponding to the interconnect target image 400 in layer B are modified relative to the OPC-ed shapes 501, 401 resulting from a conventional OPC methodology (see FIG. 11). In particular, the OPC-ed interconnect shape 402 resulting from the inventive OPC methodology is narrower than the OPC-ed interconnect shape 401 from conventional OPC. More significantly, the smallest distance between the simulated gate image 506 and simulated interconnect image 406 does not violate the inter-layer constraint C_AB_701 and would reduce or eliminate loss of yield in the manufacturing of the chip due to potential short-circuits between the gate and first interconnect layers.

Figure 13:
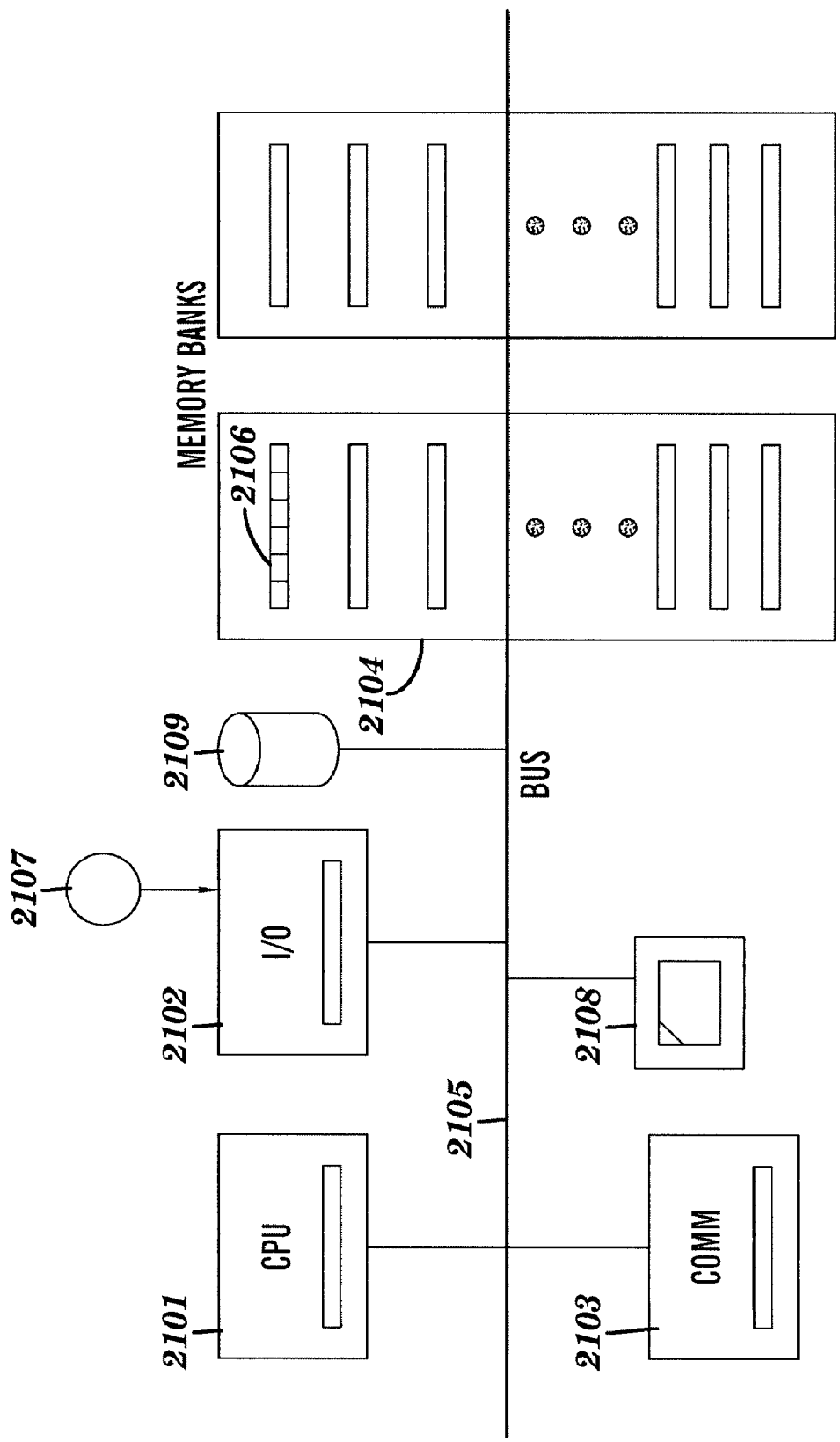
FIG. 13 is a schematic illustration of a computer system and computer program product configured to perform the method of the present invention.

The present invention may be implemented in a digital computer, or system, as shown on FIG. 13, which main components are: a central processing unit (CPU) 2101, at least one input/output (I/O) device 2102 (such as a keyboard, a mouse, a compact disk (CD) drive, and the like), a controller 2103, a display device 2108, a storage device 2109 capable of reading and/or writing computer readable code, and a memory 2106—all of which are connected, e.g., by a bus or a communications network (2105). The present invention can be implemented as a computer program product stored on a computer readable medium 2107, such as a tape or CD, or on the storage device 2109. The computer program product contains instructions to implement the method according to the present invention on a digital computer. The present invention can also be implemented in a plurality of such a digital computer where the present items may reside in close physical proximity or distributed over a large geographic region and connected by a communications network. The method according to the present invention may also be provided as a service to a client that desires to optimize a mask layout that ensures functionality of the circuit and improve yields.

While the present invention has been particularly described, in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

The invention claimed is:

1. A method of designing a mask layout for an integrated circuit, the method comprising the steps of:
   providing a plurality of mask shapes corresponding to a plurality of layers;
   providing lithographic models for said plurality of layers, said models describing processes according to which wafer images are transferred from said mask shapes to a wafer;
   determining, by using a computer, simulated wafer images resulting from transferring said plurality of mask shapes in accordance with said models;
   providing functional constraints comprising at least one functional inter-layer constraint that ensures proper functional interaction among said simulated wafer images from at least two of said plurality of layers;
   evaluating said simulated wafer images relative to other of said simulated wafer images from another one of said at least two of said plurality of layers; and
   if said at least one functional inter-layer constraint is violated, modifying said mask layout to correct said violation wherein modifying said mask layout comprises modifying said simulated wafer images from said at least two of said plurality of layers.

2. The method according to claim 1, wherein said functional constraints further comprise intra-layer constraints.

3. The method according to claim 1, further comprising the steps of:
   providing target images representing desired wafer images on said wafer; and
   providing edge placement error constraints for said simulated wafer images relative to said target images;
   and wherein the step of evaluating said simulated wafer images relative other of said simulated wafer images further comprises evaluating said simulated wafer images relative to said target images, wherein said functional constraints have higher priority than said edge placement error constraints.

4. The method according to claim 1, wherein said mask shapes comprise circuit design features.

5. The method according to claim 1, wherein said mask shapes comprise resolution enhancement technology (RET) shapes.

6. The method according to claim 5, wherein said RET shapes are selected from the group consisting of sub-resolution assist features, fill shapes, negative fill shapes, phase shift shapes, trim mask shapes and block mask shapes.

7. The method according to claim 1, wherein said at least one functional inter-layer constraints comprises a requirement that a projection on to a plane of said simulated image of a shape on a first layer encloses a projection on to said plane of said simulated image of a shape on a second layer.

8. The method according to claim 7, wherein said shape on said first layer is selected from the group consisting of a poly line shape, an interconnection shape and a diffusion layer shape.

9. The method according to claim 7, wherein said shape on said second layer is selected from the group consisting of a contact shape and a via shape.

10. The method according to claim 1, wherein said at least one functional inter-layer constraints comprises a requirement that said simulated image of a shape on a first layer is separated from said simulated image of a shape on a second layer by a predetermined minimum distance on a common projection plane between said shape on said first layer and said shape on said second layer.

11. The method according to claim 10, wherein said predetermined minimum distance is selected so as to avoid improper short-circuits or so that parasitic capacitance is not too high between circuit features corresponding to said a simulated image of said shape on said simulated image of said shape on said second layer.

12. A computer program product comprising a non-transitory computer usable medium having a computer readable program embodied in said medium for designing a mask layout for an integrated circuit, wherein the computer readable program when executed on a computer causes the computer to perform the steps of:
    providing a plurality of mask shapes corresponding to a plurality of layers;
    providing lithographic models for said plurality of layers, said models describing processes according to which wafer images are transferred from said mask shapes to a wafer;
    determining simulated wafer images resulting from transferring said plurality of mask shapes in accordance with said models;
    providing constraints comprising functional constraints that ensure proper functional interaction among said simulated wafer images;
    evaluating said simulated wafer images relative to other of said simulated wafer images from another one of said at least two of said plurality of layers; and
    if said constraints are violated, modifying said mask layout to correct said violations wherein modifying said mask layout comprises modifying said simulated wafer images from said at least two of said plurality of layers.

13. The computer program product according to claim 12, wherein said functional constraints comprise inter-layer constraints.

14. The computer program product according to claim 12, wherein said functional constraints comprise intra-layer constraints and inter-layer constraints.

15. The computer program product according to claim 12, further comprising the steps of:
    providing target images representing desired wafer images on said wafer; and
    providing edge placement error constraints for said simulated wafer images relative to said target images;
    and wherein the step of evaluating said simulated wafer images relative other of said simulated wafer images further comprises evaluating said simulated wafer images relative to said target images, wherein said functional constraints have higher priority than said edge placement error constraints.

16. The computer program product according to claim 12, wherein said mask shapes comprise circuit design features.

17. The computer program product according to claim 12, wherein said mask shapes comprise resolution enhancement technology (RET) shapes.

18. The method according to claim 17, wherein said RET shapes are selected from the group consisting of sub-resolution assist features, fill shapes, negative fill shapes, phase shift shapes, trim mask shapes and block mask shapes.

19. The method according to claim 13, wherein said inter-layer constraints comprise a requirement that a projection on to a plane of said simulated image of a shape on a first layer encloses a projection on to said plane of said simulated image of a shape on a second layer.

20. The method according to claim 19, wherein said shape on said first layer is selected from the group consisting of a poly line shape, an interconnection shape and a diffusion layer shape.

21. The method according to claim 19, wherein said shape on said second layer is selected from the group consisting of a contact shape and a via shape.

22. The method according to claim 13, wherein said inter-layer constraints comprise a requirement that said simulated image of a shape on a first layer is separated from said simulated image of a shape on a second layer by a distance that ensures non-interaction between said shape on said first layer and said shape on said second layer.

23. The method according to claim 22, wherein said distance is a pre-determined distance between a projection on to a plane of said simulated image of said shape on said first layer and a projection on to said plane of said simulated image of said shape on said second layer.

24. A method of optimizing a mask layout for an integrated circuit, wherein the mask layout includes a plurality of mask shapes corresponding to a plurality of layers, and the processes of transferring the plurality of mask shapes to a wafer is described by a set of lithographic models, the method comprising the steps of:
    determining, by using a computer, simulated wafer images resulting from transferring said plurality of mask shapes in accordance with said models;
    providing constraints comprising functional constraints that ensure proper functional interaction among said simulated wafer images;
    evaluating said simulated wafer images relative to other of said simulated wafer images from another one of said at least two of said plurality of layers; and
    if said constraints are violated, modifying said mask layout to correct said violations wherein modifying said mask layout comprises modifying said simulated wafer images from said at least two of said plurality of layers.

25. The method according to claim 24, wherein said functional constraints comprise inter-layer constraints.

26. The method according to claim 24, wherein said functional constraints comprise intra-layer constraints and inter-layer constraints.

27. The method according to claim 24, further comprising the steps of:
- providing target images representing desired wafer images on said wafer; and
- determining edge placement error constraints for said simulated wafer images relative to said target images;
- and wherein the step of evaluating said simulated wafer images relative other of said simulated wafer images further comprises evaluating said simulated wafer images relative to said target images, wherein said functional constraints have higher priority than said edge placement error constraints.

28. The method according to claim 24, wherein said mask shapes comprise circuit design features.

29. The method according to claim 24, wherein said mask shapes comprise resolution enhancement technology (RET) shapes.

30. The method according to claim 29, wherein said RET shapes are selected from the group consisting of sub-resolution assist features, fill shapes, negative fill shapes, phase shift shapes, trim mask shapes and block mask shapes.

31. The method according to claim 25, wherein said inter-layer constraints comprise a requirement that a projection on to a plane of said simulated image of a shape on a first layer encloses a projection on to said plane of said simulated image of a shape on a second layer.

32. The method according to claim 31, wherein said shape on said first layer is selected from the group consisting of a poly line shape, an interconnection shape and a diffusion layer shape.

33. The method according to claim 31, wherein said shape on said second layer is selected from the group consisting of a contact shape and a via shape.

34. The method according to claim 25, wherein said inter-layer constraints comprise a requirement that said simulated image of a shape on a first layer is separated from said simulated image of a shape on a second layer by a distance that ensures non-interaction between said shape on said first layer and said shape on said second layer.

35. The method according to claim 34, wherein said distance is a pre-determined distance between a projection on to a plane of said simulated image of said shape on said first layer and a projection on to said plane of said simulated image of said shape on said second layer.

* * * * *